United States Patent

[11] 3,622,906

[72] Inventor Paul Nyul
Flemington, N.J.
[21] Appl. No. 677,571
[22] Filed Oct. 24, 1967
[45] Patented Nov. 23, 1971
[73] Assignee RCA Corporation

[54] LIGHT-EMITTING DIODE ARRAY
7 Claims, 6 Drawing Figs.

[52] U.S. Cl. .......... 331/94.5, 29/583, 307/312
[51] Int. Cl. .......... H01s 3/04
[50] Field of Search .......... 313/108 D; 331/94.5; 307/312; 317/235 (27)

[56] References Cited
UNITED STATES PATENTS 3,290,539 12/1966 Lamorte .......... 331/94.5 X

*Primary Examiner*—Rodney D. Bennett, Jr.
*Assistant Examiner*—Daniel C. Kaufman
*Attorney*—Glenn H. Bruestle

ABSTRACT: A light-emitting diode array comprises a substrate of insulating material having one side formed with a plurality of steps. A separate row of spaced-apart, similarly oriented diodes is disposed on the tread surface of each of the steps. Corresponding diodes in the different rows are disposed in columns, and the diodes in each of the columns are connected in series.

A method of making the light-emitting diode array comprises the operations of (a) forming a plurality of steps in one side of a substrate of insulating material, (b) disposing a sheet of metal, including solder, on each of the tread surfaces, each sheet having a rear portion on a tread surface and a forward portion extending over, and spaced from, a tread surface of an adjacent lower step, (c) disposing a separate relatively large semiconductor diode between the forward portion of each sheet and the rear portion of an adjacent sheet, (d) heating the assembly of the substrate, the metal sheets, and the diodes to melt the solder and to connect the diodes in series, and (e) cutting through portions of the sheets and diodes to form a plurality of columns of relatively smaller, serially connected diodes.

PATENTED NOV 23 1971 3,622,906

INVENTOR
PAUL NYUL

BY Arthur I. Spechler
ATTORNEY

INVENTOR:
PAUL NYUL
BY Arthur I. Spechler
Attorney

INVENTOR:
PAUL NYUL

BY Arthur I. Spechler
Attorney

LIGHT-EMITTING DIODE ARRAY

The invention herein described was made in the course of a contract with the Department of the Army.

BACKGROUND OF THE INVENTION

This invention relates generally to light-emitting semiconductor devices, and more particularly to an improved array of light-emitting diodes and an improved method of making the array. The improved array is particularly useful for producing aligned beams of coherent light that has applications, e.g., in the radar and navigation fields.

It has been proposed to provide an array of light-emitting, semiconductor diodes by manually disposing a plurality of diodes on a substrate and connecting the diodes in a series and/or series-parallel array. These prior art arrays, however, have been relatively difficult and expensive to manufacture because the light-emitting diodes, especially laser diodes, are very small and consequently difficult to arrange manually in an optically aligned pattern. Where a high packing density of diodes was desired, prior art arrays have exhibited relatively poor heat dissipation.

The improved method provides improved arrays that substantially overcome or minimize the aforementioned disadvantages of the prior art arrays. The improved arrays include a high packing density of light-emitting diodes in good optical alignment and in a good heat-dissipating arrangement for high-power operation.

SUMMARY OF THE INVENTION

Briefly stated, the improved diode array comprises a body of insulating material having a side formed with a plurality of steps. A plurality of spaced-apart diodes are disposed on the tread surface of each of the steps, and corresponding diodes on the different tread surfaces are disposed in columns and electrically connected in series.

The improved light-emitting diode array is made by stacking alternate conductive sheets and relatively larger diodes on the steps of the substrate, a single large diode occupying each step. The stacked assembly is then bonded together, connecting the large diodes in series, and the large diodes are cut into a plurality of smaller diodes, preferably forming aligned columns of the smaller diodes.

DESCRIPTION OF THE PREFERRED EMBODIMENTS

Figure 4:
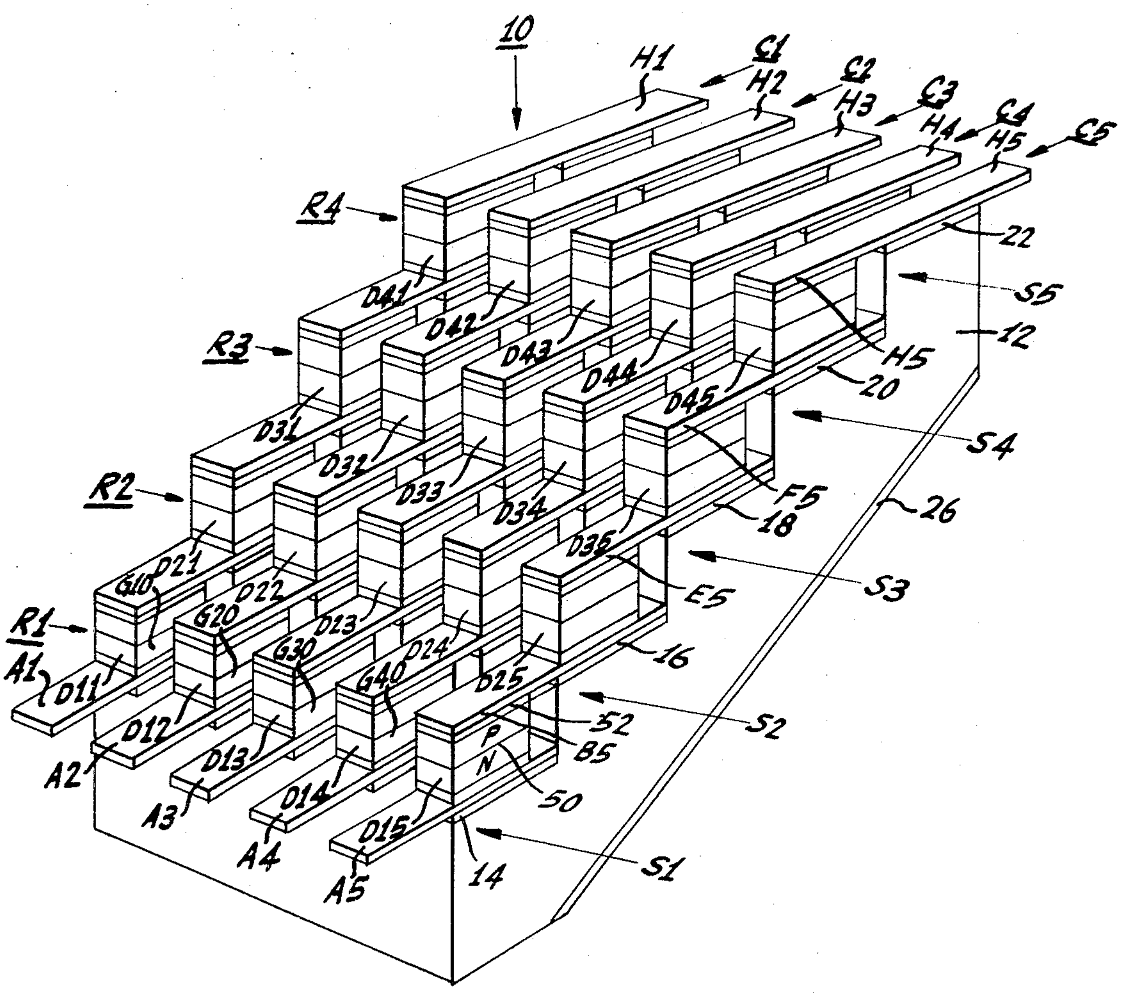
FIG. 4 is a perspective view of the improved array showing the large diodes, illustrated in FIG. 3, cut into rows of spaced-apart, similarly oriented, relatively smaller diodes during still another operation in the improved method.

Referring now particularly to FIG. 4 of the drawings, there is shown one embodiment of an improved light-emitting diode array 10 made by the improved method. The array 10 comprises a substrate of electrically insulating material, such as a wafer 12 of beryllium oxide, aluminum oxide, or silicon, for example. The wafer 12 should be a good electrical insulator as well as a good conductor of heat. A plurality of steps S1–S5 are formed in one side of the wafer 12 by any suitable means. The tread surfaces of the steps S1–S5 are metallized, as by metal layers 14, 16, 18, 20, and 22, respectively, in a manner well known in the art. The lower major surface 24 of the wafer 12 is also metallized with a metal layer 26. The layers 14–22 and 26 may comprise successive coatings of "Moly-manganese," nickel, and gold.

A plurality of spaced-apart, similarly oriented, semiconductor diodes D11–D15, D21–D25, D31–D35, D41–D45, referred hereinafter as D11–D45, are arranged in rows R1–R4 and columns C1–C5 on the steps S1–S5 of the stepped wafer 12. Each of the diodes in the rows R1–R4 has a contact surface electrically connected to the layers 14–20, respectively. The diodes in each of the columns C1–C5 are electrically connected in series. Thus, for example, the diodes D15, D25, D35 and D45 in the column C5 are connected in a series circuit with metal sheets A5, B5, E5, F5, and H5. The sheets A5, B5, E5, E5, and H5 are fixed to the metallized layers 14–22 on the tread surface of the steps S1–S5, respectively, by solder. The diodes in the other columns C1–C4 are disposed and connected in a manner similar to those in the column C5.

Since the diodes in each of the columns are fixed to the wafer 12 and electrically connected in a similar manner, the details of these connections will be described, by way of example, with respect to one diode only, the diode D15 in the row R1 and the column C5. The diode D15 may comprise a light-emitting diode, such as a laser diode of gallium arsenide, having contiguous P-type and N-type regions and a PN-junction 50 therebetween. The upper surface of the P-region of the diode D15 is provided with a metallized contact layer 52 and the lower surface of the N-type region of the diode D15 is provided with a metallized contact layer 54. The contact layer 54 may comprise successive coatings of tin, nickel, gold, and lead solder, and the contact layer 52 may comprise successive coatings of nickel, gold, and lead solder, in a manner well known in the art. The sheets A5 and B5 may comprise goldfoil coated (tinned) with lead solder and electrically connected to the contact layers 54 and 52, respectively, of the diode D15.

In the embodiment of the light-emitting array 10, illustrated in FIG. 4, the columns C1–C5 of the diodes are electrically isolated from each other by relatively deep grooves G10, G20, G30, and G40 which extend into the substrate wafer 12. Each of the diodes D11–D45 is a laser diode having a substantially parallelepiped structure, wherein the front and rear relatively smaller opposite surfaces are cleaved surfaces which are both light reflecting and light transmitting, and wherein the relatively larger opposite side surfaces are rendered light absorbing, as by roughening due to sawing, for example. In each of the diodes D11–D45, the surface adjacent and facing the riser of a respective step may be made totally light reflecting, by any means known in the art, for optimum light emission of the diodes.

In operation, each of the diodes in each of the columns C1–C5 emits light in substantially the plane of its PN-junction, from its light-reflecting surfaces, when a voltage is applied across each of the columns C1–C5 of diodes and current is caused to flow through each of the diodes in a forward direction. If this voltage is sufficient to cause the current through each of the diodes to be above a threshold value for the diode, the diode lases, that is, coherent light is emitted through the light-emitting surface in a direction substantially parallel to the plane of the PN-junction. If the diodes D11–D45 are laser diodes of gallium arsenide and if the current density through them is at or above a threshold value of about 1,000 amperes/sq. cm., for example, a populated inversion of charge carriers is produced in the P-type region of each of the diodes and stimulated emission of radiation takes place, producing coherent light in the infrared region with a wavelength of between 8,400 and 8,500 A. at a temperature of about 77° K. At higher temperatures, the threshold current is greater and may have to comprise relatively short pulses to prevent excessive heating of the diodes. When the current through the diodes is below the threshold value for a given temperature, the diodes emit incoherent light.

By the term "light," as used herein, is meant electromagnetic radiation in either the visible and/or invisible regions of the electromagnetic spectrum.

Figure 1:
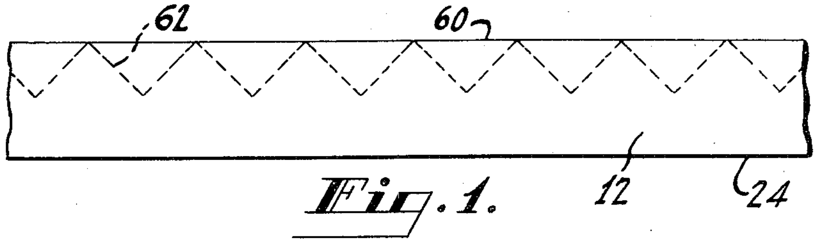
FIG. 1 is a fragmentary, side elevational view of a (wafer) substrate of electrically insulating material used in the manufacture of an improved light-emitting array, the dashed zigzag line indicating where a plurality of steps are to be formed in one side of the substrate.
Figures 2, 5, 6:
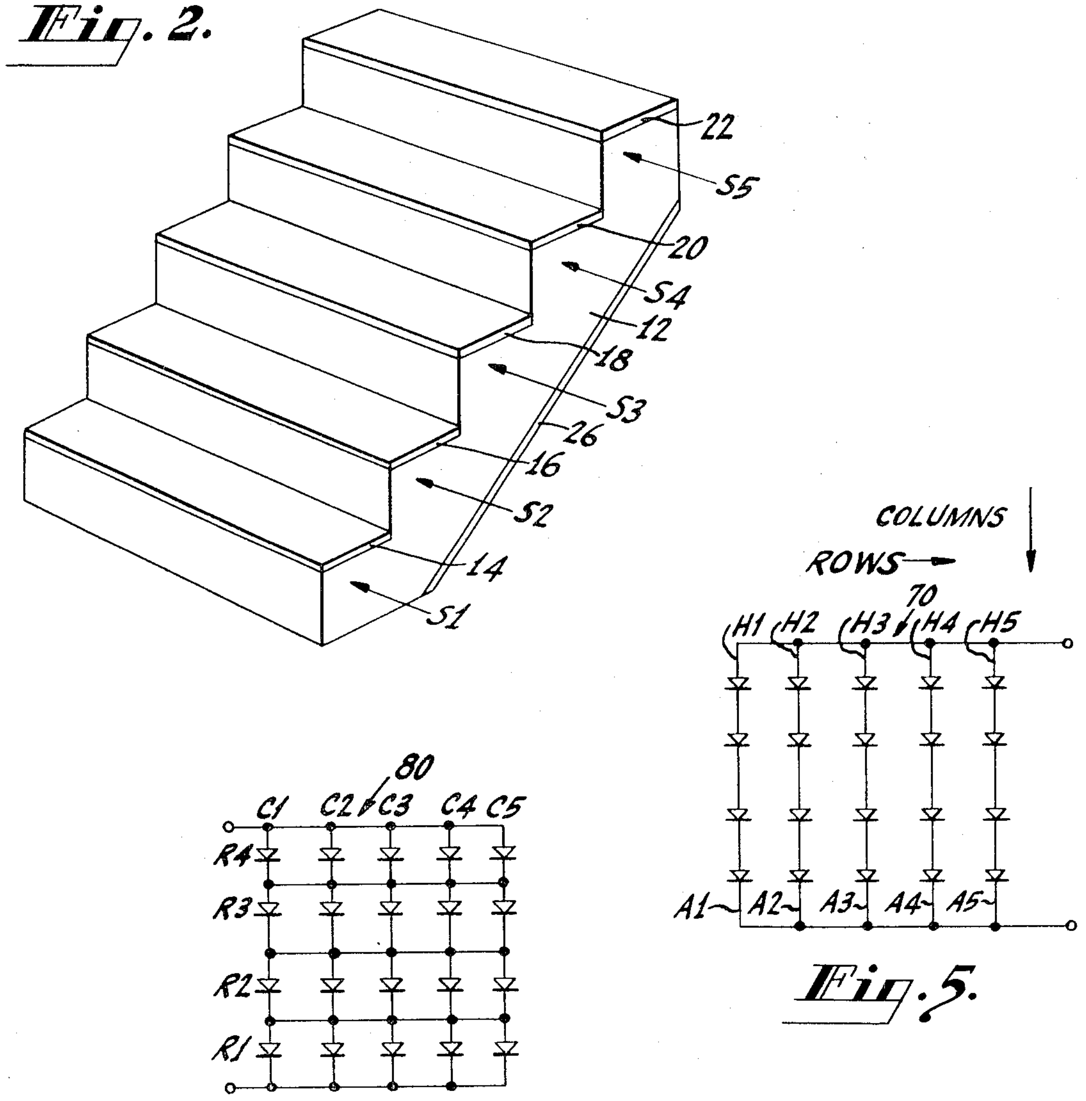
FIG. 2 is a perspective view of the substrate shown in FIG. 1, with a plurality of steps formed in one side thereof and partly metallized during one operation in the improved method.
FIG. 5 is a schematic circuit diagram of one embodiment of the improved array, formed by deep cuts and showing five columns of diodes connected in parallel.
FIG. 6 is a schematic circuit diagram of another embodiment of the improved array, formed by shallow cuts and showing the diodes connected in a fail-safe series-parallel circuit.

Referring now to FIG. 1, there is shown the substrate wafer 12 used in the manufacture of the array 10. The upper surface 60 of the wafer 12 is cut, as by filing or sawing to the zigzag line 62, to form a plurality of steps S1–S5, as shown in FIG. 2. The tread surfaces of each of the steps S1–S5 are metallized with the metal layers 14–22, respectively, to provide means for attaching the diodes of the array 10 to the steps S1–S5. The lower surface 24 of the substrate wafer 12 is also metallized with the metal layer 26, as shown in FIG. 2.

A plurality of relatively large sheets A, B, E, F and H are disposed in contact with the layers 14, 16, 18, 20 and 22 on the steps S1–S5, respectively. The sheets A,B, E, F, and H are larger than the tread surfaces of the steps S1–S5, respectively, and are disposed so that a rear portion of each sheet is in contact with the metal layer on the tread surface, and a front portion of each sheet extends over the tread portion of an adjacent lower sheet. Thus, for example, each of the sheets A, B, E, F, and H is about twice as large as the tread surface on which it rests. The material of the sheets A, B, E, F, and H is the same as that described for the sheet A5, the latter being a part of the sheet A. The sheets A, B, E, F, and H are preferably of high electrical conductivity, such as goldfoil, and have a coating of solder on both sides thereof.

Figure 3:
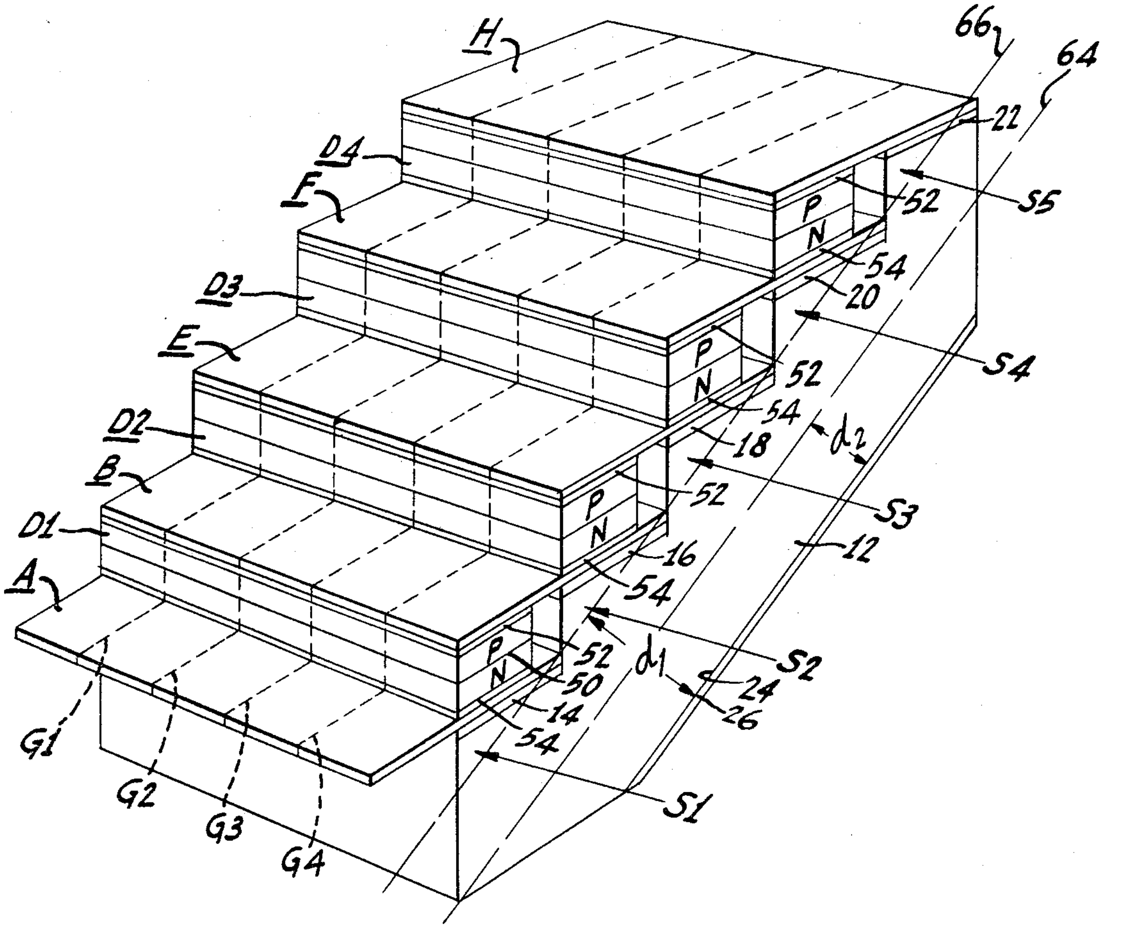
FIG. 3 is a perspective view of the substrate showing relatively large diodes disposed between metal sheets on the steps of the substrate during another operation in the improved method.

A plurality of relatively large diodes D1, D2, D3 and D4 are disposed between the sheets A, B, E, F and H so that each of the large diodes is between the rear portion of one sheet and the front portion of an adjacent sheet. Thus, for example, the diode D1 is disposed between the rear portion of the sheet A and the front portion of the sheet B, as shown in FIG. 3. Each of the diodes D1, D2, D3, and D4 is spaced from the riser surface of the next adjacent step to that on which it rests and has a pair of upper and lower contact layers 52 and 54 as described for the relatively smaller diodes D11–D45.

The sheets A, B, E, F, and H are physically and electrically connected to the layers 14–22, respectively, and the diodes D1, D2, D3 and D4 are electrically connected in series with each other through these sheets by placing the assembly of wafer 12, the sheets A, B, E, F, and H, and the diodes D1, D2, D3, and D4, arranged as shown in FIG. 3, in an oven and heating them to about 230° C. for about 5 seconds so that the solder melts. When cooled, the diodes D1, D2, D3, and D4 are electrically connected in a series circuit with the sheets A, B, E, F, and H fixed to the substrate wafer 12 by means of the layers 14–22, respectively. Such an arrangement permits the diodes D1, D2, D3, and D4 to dissipate their heat directly into the substrate wafer 12 from where it may be removed by an additional heat sink (not shown) fixed to the layer 26, in a manner known in the art.

The improved, light-emitting array 10, comprising the relatively smaller diodes D11–D45, is formed from the assembly shown in FIG. 3 by cutting a plurality of grooves through portions of the sheets A, B, E, F, and H and the larger diodes D1, D2, D3, and D4, as with a ganged saw or multiple wire cutter known in the art. Thus the grooves G10, G20, G30, and G40 (FIG. 4) are formed by cutting the assembled structure shown in FIG. 3 along the dashed lines G1, G2, G3, and G4, respectively. If it is desired, as shown in the improved array 10, that the columns of the diodes be completely separated from each other, the grooves G10, G20, G30, and G40 should extend into the wafer 12 to the depth indicated by the dashed line 64 shown in FIG. 3.

The operation of forming, that is, cutting the grooves G10, G20, G30, and G40 in the assembled soldered structure, divides the diodes D1, D2, D3, and D4 into the rows R1, R2, R3 and R4, respectively, of relatively smaller diodes, as shown in FIG. 4. Also, the relatively larger sheets A, B, E, F, and H are divided into rows of relatively smaller sheets. For example, the large sheet H, shown in FIG. 3, is divided into smaller sheets H1, H2, H3, H4 and H5 by the grooves G10, G20, G30 and G40, as shown in FIG. 4. The other large sheets A, B, E, and F are similarly divided, and the smaller sheets are designated by the same numbering scheme.

If it is desired to connect the column C1–C5 in a parallel circuit, the sheets H1, H2, H3, H4, and H5 are connected to each other, and the sheets A1, A2, A3, A4, and A5 are connected to each other, as illustrated schematically by the embodiment of an improved array 70, shown schematically in FIG. 5.

Another embodiment of an improved array 80 is illustrated schematically in FIG. 6, wherein the diodes in the columns C1–C5 are connected in series, and wherein the diodes in the rows R1–R4 are connected in parallel. Such a circuit is a failsafe one because a failure in any one of the diodes in the circuit will not interrupt current through the remainder of the circuit. The improved array 80 is formed from the assembled and soldered structure, shown in FIG. 3, by cutting the grooves G10, G20, G30 and G40 along the dashed line G1, G2, G3, and G4, respectively, to a depth of the dashed line 66, whereby the grooves G10, G20, G30 and G40 do not completely sever the sheets A, B, E, F, and H. Under these conditions, the smaller diodes in each of the rows R1, R2, R3 and R4 remain connected in parallel and the diodes in each of the columns C1–C5 are connected in series, providing the electrical structure schematically shown in FIG. 6.

What is claimed is:

1. An array of diodes comprising:
a substrate of insulating material having one side formed with a plurality of steps, each step having a tread surface,
a separate row of spaced-apart diodes disposed on each of said tread surfaces,
corresponding diodes in the rows being disposed in columns, and
means electrically connecting the diodes in each of said columns in series.

2. An array as described in claim 1 wherein:
said substrate comprises an insulating material chosen from the group consisting of beryllium oxide, aluminum oxide, and silicon, and
means, including said electrically connecting means, fix said diodes to said tread surfaces.

3. An array as described in claim 2 wherein said fixing means comprises metal layers coated on said tread surfaces, and
said metal layers connect said diodes in each of said rows in parallel.

4. An array as described in claim 2 wherein
said columns of diodes are connected in parallel, and
said diodes in each of said rows have PN junctions that lie in substantially the same plane.

5. An array as described in claim 1 where
said steps are substantially similar to each other,
said diodes are fixed to said tread surfaces, and
said diodes in each row are similarly oriented and have PN junctions that lie in substantially the same plane.

6. A semiconductor diode array comprising:
a substrate of insulating material having a series of steps formed therein:
a plurality of conductive contacts, one disposed on each step and extending beyond its step out over the next lower step;
a plurality of light-emitting semiconductor diodes, one disposed on each step and electrically connected between the contact on that step and the contact extending from the next higher step, whereby a column of serially connected diodes is provided.

7. A semiconductor diode array according to claim 6 and further including a plurality of said diodes in a row on each of said steps with corresponding diodes in said rows constituting said column of serially connected diodes, whereby a plurality of said columns are provided.

* * * * *